United States Patent
Yoon et al.

(10) Patent No.: US 7,230,815 B2
(45) Date of Patent: Jun. 12, 2007

(54) MULTILAYERED CHIP CAPACITOR AND PRINTED CIRCUIT BOARD HAVING EMBEDDED MULTILAYERED CHIP CAPACITOR

(75) Inventors: Hee Soo Yoon, Kyungki-do (KR); Chang Hoon Shim, Kyungki-do (KR); Don Cheol Choi, Icheon (KR); Dong Hwan Lee, Kyungki-do (KR)

(73) Assignee: Samsung Electro-Mechanics Co., Ltd, Kyungki-Do (KR)

( * ) Notice: Subject to any disclaimer, the term of this patent is extended or adjusted under 35 U.S.C. 154(b) by 0 days.

(21) Appl. No.: 11/288,802

(22) Filed: Nov. 29, 2005

(65) Prior Publication Data
US 2006/0139849 A1    Jun. 29, 2006

(30) Foreign Application Priority Data
Dec. 24, 2004  (KR)  ............... 10-2004-0112412

(51) Int. Cl.
*H01G 4/005* (2006.01)
*H01G 4/06* (2006.01)
(52) U.S. Cl. .............. 361/303; 361/311; 361/306.3
(58) Field of Classification Search ........ 361/303–305, 361/311, 306.1, 306.3, 308.1, 309
See application file for complete search history.

(56) References Cited

U.S. PATENT DOCUMENTS

| 4,800,459 | A | * | 1/1989 | Takagi et al. | ............ | 361/321.2 |
|---|---|---|---|---|---|---|
| 4,831,494 | A | * | 5/1989 | Arnold et al. | ............ | 361/306.3 |
| 6,243,253 | B1 | * | 6/2001 | DuPre et al. | ............ | 361/306.3 |
| 6,292,351 | B1 | * | 9/2001 | Ahiko et al. | ............ | 361/306.3 |
| 6,380,619 | B2 | * | 4/2002 | Ahiko et al. | ............ | 257/703 |
| 6,407,929 | B1 | | 6/2002 | Hale et al. | | |
| 7,023,688 | B2 | * | 4/2006 | Kazama | ............ | 361/321.1 |
| 2006/0133057 | A1 | * | 6/2006 | McGregor et al. | ............ | 361/763 |

FOREIGN PATENT DOCUMENTS

| JP | 06-251981 | 9/1994 |
|---|---|---|
| KR | 1993-0010076 | 10/1993 |

* cited by examiner

*Primary Examiner*—Eric W. Thomas
(74) *Attorney, Agent, or Firm*—Volpe And Koenig P.C.

(57) ABSTRACT

A multilayered chip capacitor (MLCC) includes internal electrodes and external electrodes formed to be perpendicular to the internal electrodes, whereby parasitic capacitance is reduced, resulting in no parallel resonance frequency effects. In addition, the MLCC has a capacitor structure, which provides a first surface and a second surface formed in a stacking direction of the dielectric layers in the capacitor body as a top surface and a bottom surface. Hence, in the thin capacitors having the same size, the number of internal electrode layers is increased, thereby reducing the equivalent series resistant (ESR) and equivalent series inductance (ESL). Further, the printed circuit board (PCB) having an embedded MLCC is easily manufactured.

8 Claims, 9 Drawing Sheets

PRIOR ART

FIG. 1a

PRIOR ART

FIG. 1b

PRIOR ART

FIG. 1c

PRIOR ART

FIG. 2a

PRIOR ART

MULTILAYERED CHIP CAPACITOR AND PRINTED CIRCUIT BOARD HAVING EMBEDDED MULTILAYERED CHIP CAPACITOR

RELATED APPLICATIONS

The present application is based on, and claims priority from, Korean Application Number 2004-0112412, filed Dec. 24, 2004, the disclosure of which is incorporated by reference herein in its entirety.

BACKGROUND OF THE INVENTION

1. Field of the Invention

The present invention relates, generally, to a multilayered chip capacitor (MLCC), and, more particularly, to a thin MLCC having excellent properties, which is suitable for embedding in a printed circuit board (PCB), and a PCB having an embedded MLCC.

2. Description of the Related Art

In general, an MLCC has a structure composed of a plurality of dielectric layers and a plurality of internal electrodes interposed between the dielectric layers. The MLCC, which is advantageous because it has a small size, a high capacitance and easy mountability, is widely applied to various electronic devices.

Recently, to decrease the overall package size and improve performance, the MLCC has been used in the state of being embedded in PCBs for memory cards, PC main boards and various RF modules. Such an MLCC is described with reference to a conventional MLCC shown in FIGS. 1a and 1b.

Figure 1A:
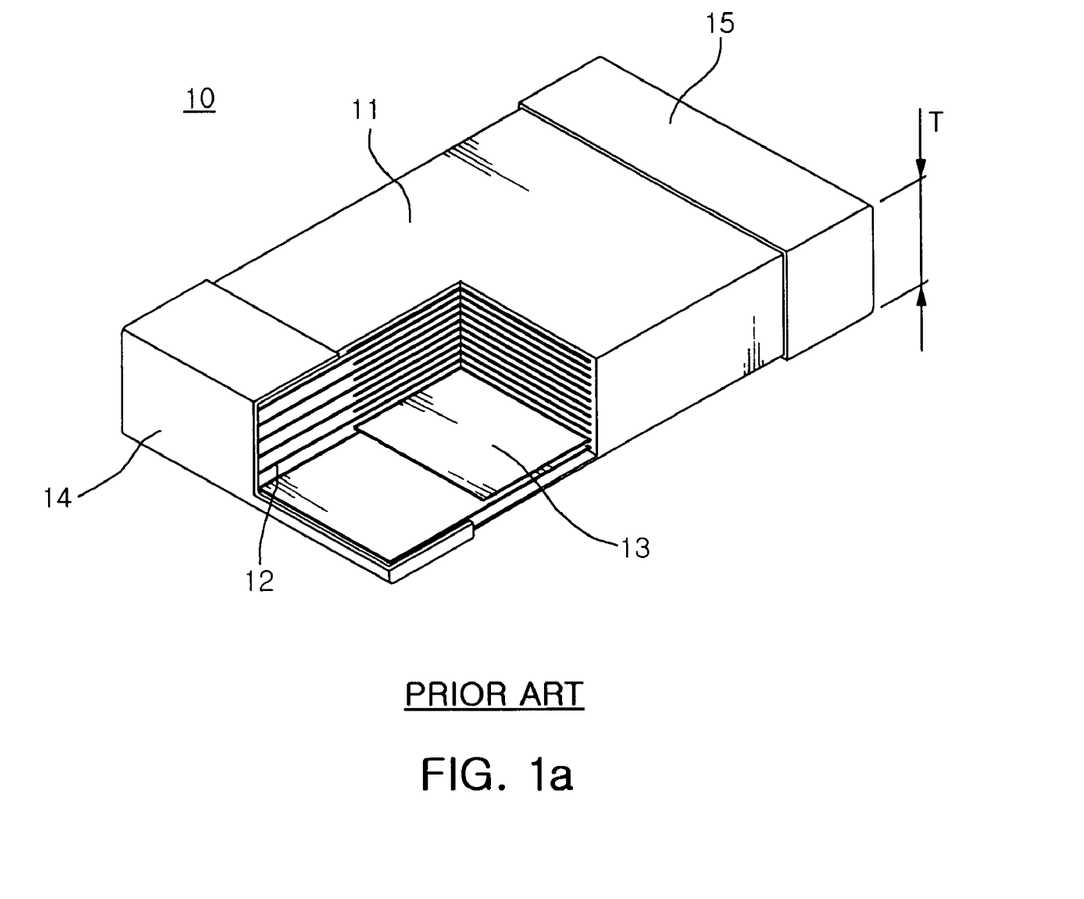
FIGS. 1a and 1b are a schematic perspective view and a side sectional view, respectively, showing a conventional MLCC.
Figure 1B:
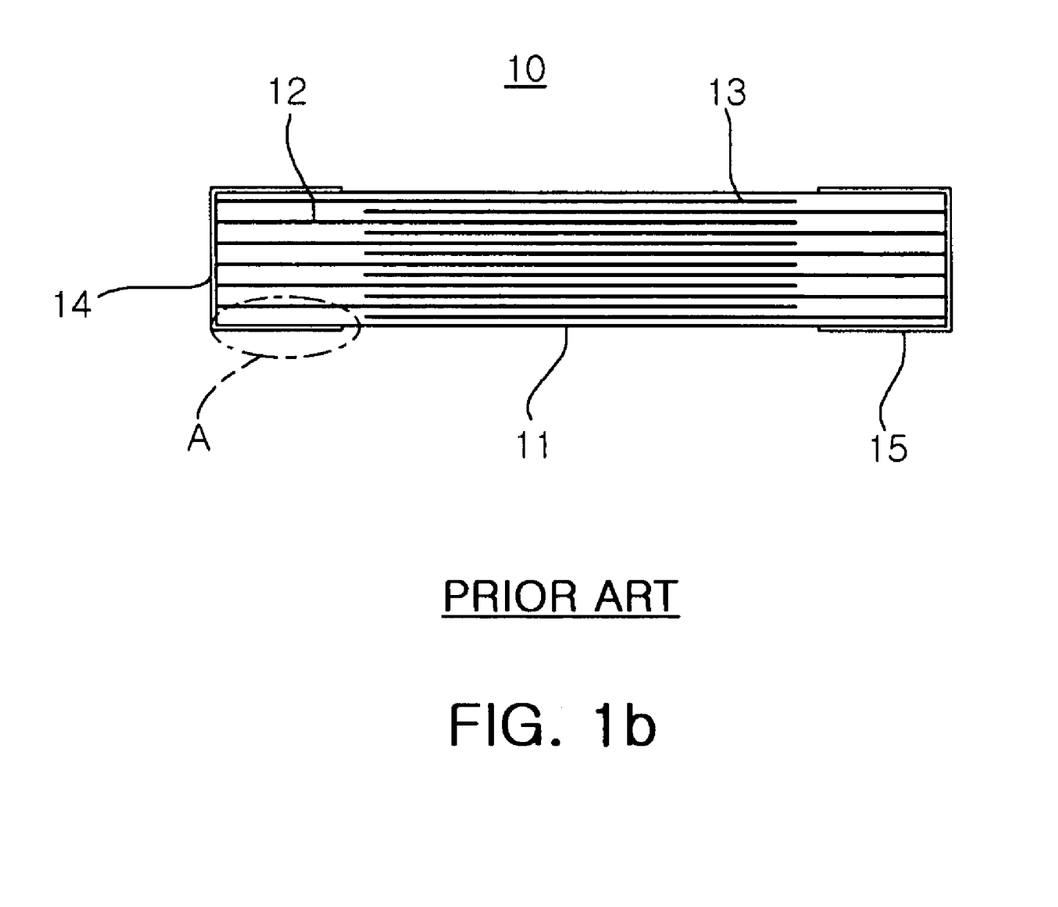

FIGS. 1a and 1b are a schematic perspective view and a side sectional view, respectively, showing a conventional thin capacitor.

As shown in FIGS. 1a and 1b, a conventional MLCC 10 includes a capacitor body 11 formed by stacking a plurality of dielectric layers. First and second internal electrodes 12 and 13 are alternately formed on the plurality of dielectric layers. In addition, the first and second internal electrodes 12 and 13 face other second and first internal electrodes 13 and 12 with one of the plurality of dielectric layers interposed therebetween, and are connected, respectively, to first and second external electrodes formed on both side surfaces of the capacitor body 11.

Typically, since the first and second external electrodes 14 and 15 are manufactured in such a way that both side surfaces of the capacitor body 11 are dipped into a metal paste, they may be formed to extend the other surfaces neighboring the side surfaces of the capacitor body 11. In particular, when the above MLCC 10 is embedded in the PCB, the regions of the external electrodes, which extend the top and bottom surfaces of the capacitor body 11, allow the external electrodes of the capacitor to be connected to conductive via holes or conductive lines of the PCB.

Figure 2A:
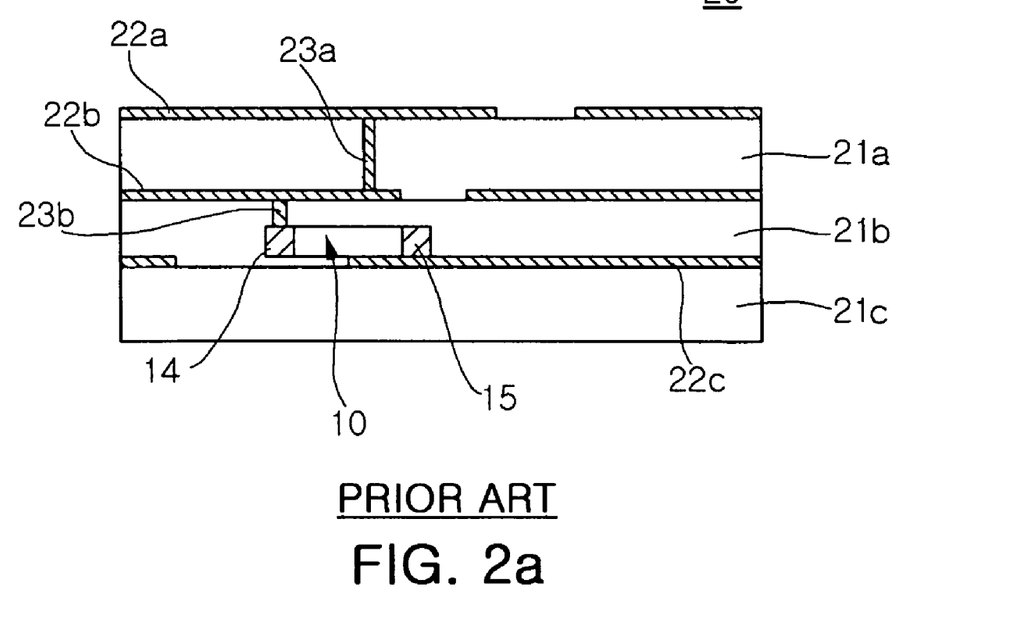
FIGS. 2a and 2b are a side sectional view and a top plan view, respectively, showing a PCB in which the conventional MLCC has been embedded.

Turning now to FIG. 2a, there is illustrated a PCB 20 in which the MLCC 10 of FIG. 1a has been embedded. The PCB 20 is composed of three layers 21a, 21b and 21c, on which predetermined conductive lines 22a, 22b and 22c are formed. A cavity C is formed in the middle layer 21b of the PCB 20, and the MLCC 10 is mounted in the cavity C. As such, the conductive line 22a to which chip components (not shown) are mounted, along with the conductive line 22b of the other layer 21b, is connected to the regions of the first external electrodes 14 positioned on the top surface of the capacitor 10 through the conductive via holes 23a and 23b.

Also, the ground conductive line 22c is connected to the regions of the second external electrodes 15 positioned on the bottom surface of the capacitor 10 by soldering.

Figure 1C:
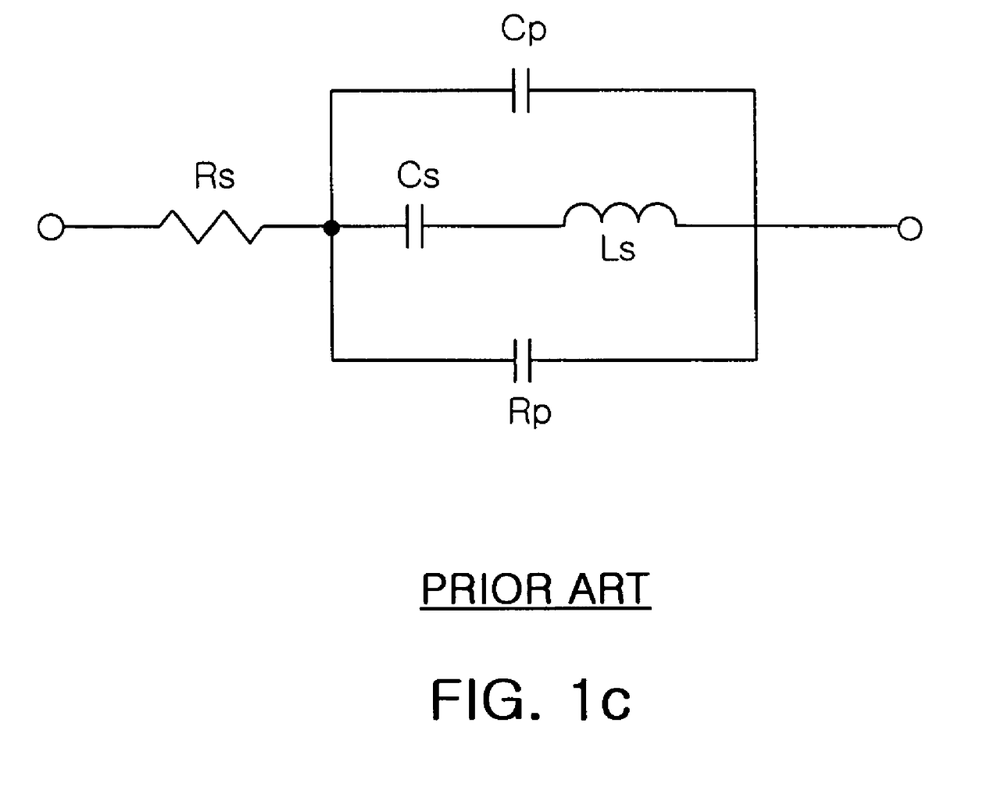

As is apparent from the equivalent circuit diagram of FIG. 1c, the MLCC 10 has not only capacitance Cs, which is an actual value, but also equivalent series resistance (ESR) Rs and insulation resistance Rp due to resistance loss of the dielectric layer and resistance loss of the electrode layer, and parasitic capacitance Cp and equivalent series inductance (ESL) Ls.

With the aim of easily embedding such an MLCC 10 in the PCB 20, the MLCC 10 should be manufactured to have a low thickness T. For this, a thin dielectric layer having a high dielectric constant is required. In the portion represented by A in FIG. 1b, the intervals between the internal electrodes 12 and 13 and the regions of the external electrodes 14 and 15 formed on the top and bottom surfaces of the capacitor body 11 are decreased, hence increasing parasitic capacitance Cp. As such, such parasitic capacitance Cp may cause an undesired parallel resonance frequency at a high frequency together with the ESL Ls.

Figure 2B:
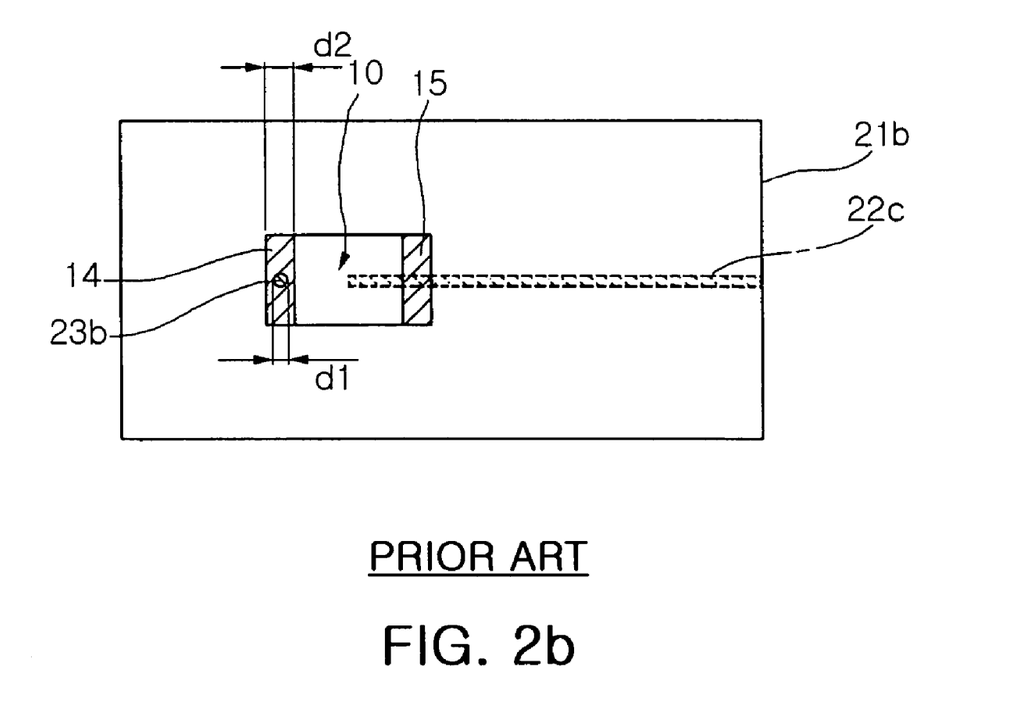

Meanwhile, the MLCC 10 is disadvantageous in that because the areas of the external electrodes extending the top and bottom surfaces of the capacitor body 11 are small, it is difficult to embed the MLCC 10 in the PCB 20. For example, as in FIG. 2b, in the case in which the conductive via hole 23b is connected to the first external electrodes 14, the widths $d_2$ of the upper regions of the first external electrodes 14 are small, and thus, an allowable range of variation of the diameter $d_1$ of the via hole becomes narrow. To solve such a problem, the upper and lower regions of the first and second external electrodes 14 and 15 may be sufficiently enlarged. As a result, however, the parasitic capacitance Cp is increased, and as well, in more severe cases, short circuits between the external electrodes 14 and 15 may be caused.

SUMMARY OF THE INVENTION

Accordingly, the present invention has been made keeping in mind the above problems occurring in the related art, and an object of the present invention is to provide a novel MLCC having low parasitic capacitance and low ESL to improve the reliability of a device when being operated under conditions of high frequency, and having a structure capable of easily performing a process of connecting external electrodes thereof to components in a PCB when being embedded in the PCB.

Another object of the present invention is to provide a PCB in which such an MLCC is embedded.

In order to accomplish the above objects, the present invention provides an MLCC, comprising a capacitor body which is formed by stacking a plurality of dielectric layers and provides opposite first and second surfaces formed in a stacking direction of the plurality of dielectric layers as top and bottom surfaces, at least one pair of first and second internal electrodes which is formed on the plurality of dielectric layers to be spaced apart from the top and bottom surfaces of the capacitor body and is alternately arranged on the plurality of dielectric layers so that one electrode of one pair of internal electrodes faces the other electrode of the one pair of internal electrodes with one of the plurality of dielectric layers interposed therebetween, first and second external electrodes formed on the top and bottom surfaces, respectively, of the capacitor body, a plurality of first leads protruding from the first internal electrodes so that the first internal electrodes are connected to the first external electrodes, and a plurality of second leads protruding from the second internal electrodes so that the second internal electrodes are connected to the second external electrodes.

To ensure sufficient area required to be connected to predetermined conductive lines of a PCB, at least one of the first and second external electrodes is formed over almost the entire area of the top and bottom surfaces of the capacitor body. In addition, to prevent the undesired connection of side surfaces of the capacitor to conductive lines or via holes of the PCB, at least one of the first and second external electrodes is spaced apart from at least one edge of the top and bottom surfaces on which the at least one external electrode has been formed.

Preferably, the first and second leads are formed in the identical numbers at positions opposite each other. As such, two each of the first and second leads are formed at both ends on one side of the corresponding internal electrodes. Also, at least one lead is further included between the two first leads and between the two second leads.

Further, the present invention provides a PCB having an embedded MLCC. The PCB having an embedded MLCC of the present invention comprises a multilayered PCB which includes a plurality of layers and a plurality of conductive lines thereon, and an MLCC which includes a capacitor body formed by stacking a plurality of dielectric layers and provides opposite first and second surfaces formed in a stacking direction of the plurality of dielectric layers as top and bottom surfaces, and first and second external electrodes formed on the top and bottom surfaces, respectively, of the capacitor body, and which is embedded in the multilayered PCB to electrically connect the first and second external electrodes of the MLCC to predetermined conductive lines of the PCB. As such, the MLCC includes at least one pair of first and second internal electrodes which is formed on the plurality of dielectric layers to be spaced apart from the top and bottom surfaces of the capacitor body and is alternately arranged on the plurality of dielectric layers so that one electrode of one pair of internal electrodes faces the other electrode of the one pair of internal electrodes with one of the plurality of dielectric layers interposed therebetween, a plurality of first leads protruding from the first internal electrodes so that the first internal electrodes are connected to the first external electrodes, and a plurality of second leads protruding from the second internal electrodes so that the second internal electrodes are connected to the second external electrodes.

Also, the electrical connection between at least one of the first and second external electrodes and the predetermined conductive line is realized using a conductive via hole formed through the PCB or by direct soldering to the corresponding conductive line.

BRIEF DESCRIPTION OF THE DRAWINGS

The above and other objects, features and other advantages of the present invention will be more clearly understood from the following detailed description taken in conjunction with the accompanying drawings, in which:

FIG. 1c is an equivalent circuit diagram of the MLCC of FIG. 1a;

DESCRIPTION OF THE PREFERRED EMBODIMENTS

Hereinafter, a detailed description will be given of the present invention, with reference to the appended drawings.

Figure 3A:
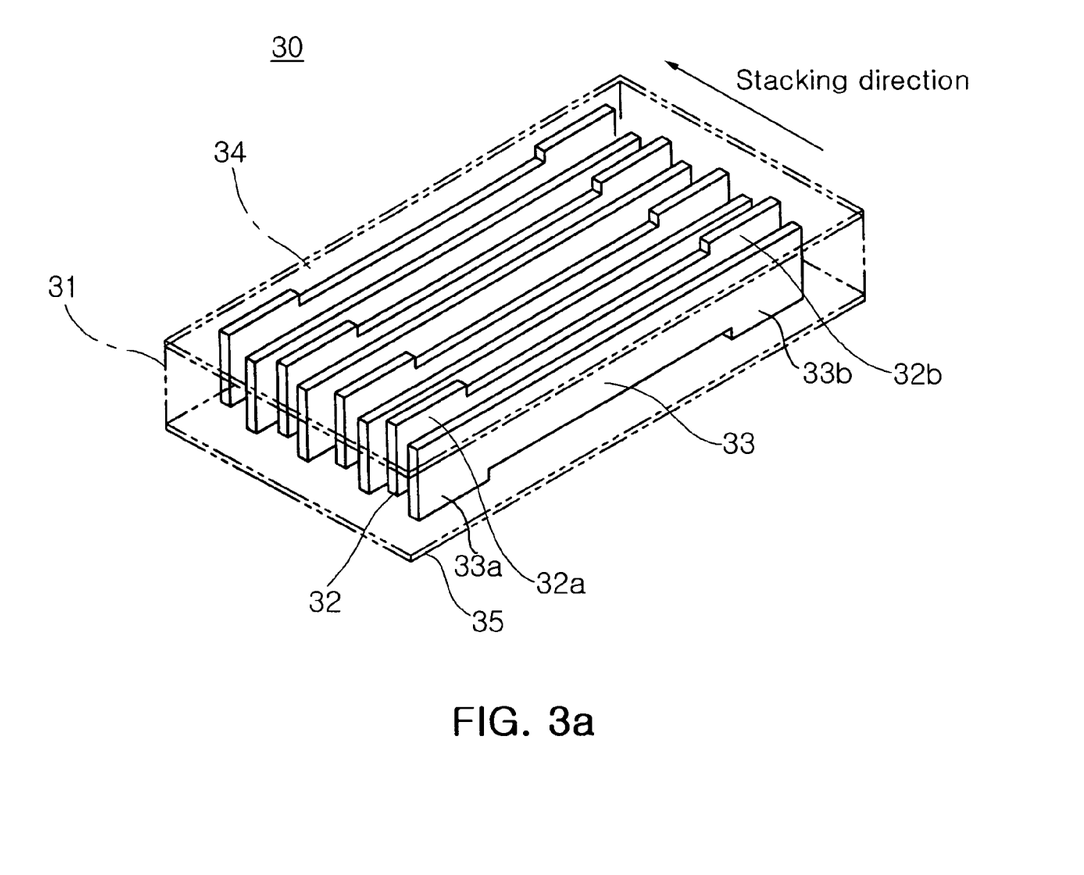
FIGS. 3a and 3b are a schematic perspective view and a side sectional view, respectively, showing an MLCC according to a first embodiment of the present invention.
Figure 3B:
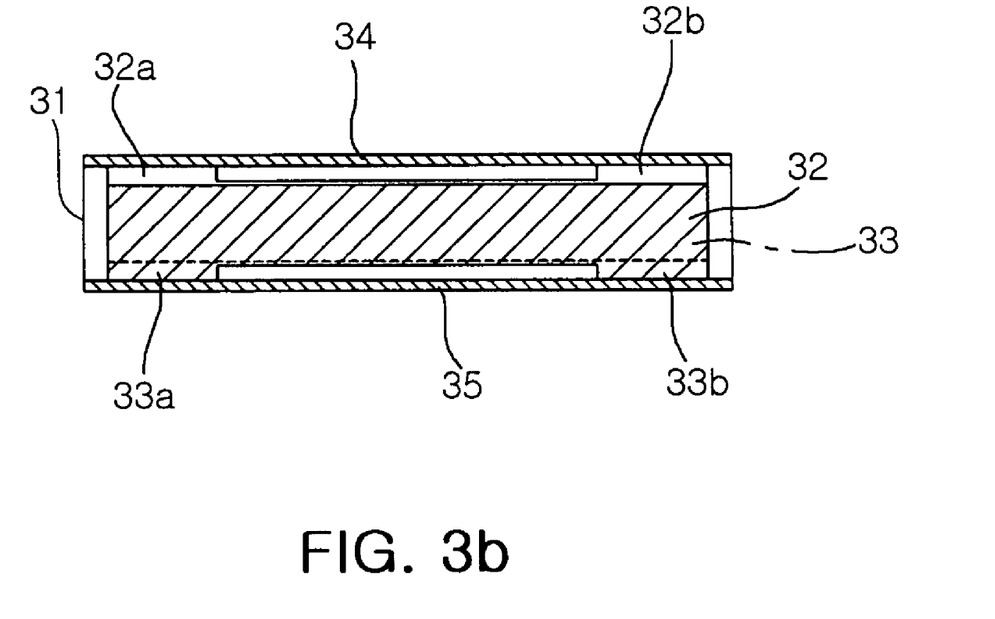

FIGS. 3a and 3b are a schematic perspective view and a side sectional view, respectively, showing an MLCC according to a first embodiment of the present invention.

As shown in FIG. 3a, the MLCC 30 comprises a capacitor body 31 formed by stacking a plurality of dielectric layers. The capacitor body 31 provides two opposite surfaces formed in a stacking direction of the dielectric layers as top and bottom surfaces thereof. The capacitor body 31 preferably has a thickness smaller than lengths and widths of the top and bottom surfaces thereof, to be embedded in PCBs. On the top and bottom surfaces of the capacitor body 31, first and second external electrodes 34 and 35 are formed.

On the dielectric layers constituting the capacitor body 31, first and second internal electrodes 32 and 33 are formed. The first and second internal electrodes 32 and 33 face other second and first internal electrodes 33 and 32 with one of the plurality of dielectric layers interposed therebetween. In addition, the first and second internal electrodes 32 and 33 are connected to the first and second external electrodes 34 and 35, respectively, formed on the top and bottom surfaces of the capacitor body 31.

In the present embodiment, the external electrodes 34 and 35 are arranged perpendicularly to the internal electrodes 32 and 33, to drastically reduce parasitic capacitance. Hence, a parallel resonance frequency is shifted to exceed an available frequency, and thus, negative effects due to parallel resonance frequency may be prevented. Further, when manufacturing the thin MLCC, the number of internal electrode layers may be sufficiently increased while decreasing the areas of the internal electrodes. In such cases, since the resistance and inductance components are disposed in parallel, the effect of resistance and inductance in each internal electrode may be effectively reduced, thereby obtaining the desirably low ESR and ESL.

Each of the first and second internal electrodes 32 and 33 has two first and second leads 32a and 32b, and 33a and 33b. The first and second leads 32a and 32b, and 33a and 33b, are protruding from the first and second internal electrodes 32 and 33, to connect the first and second internal electrodes 32 and 33 to the first and second external electrodes 34 and 35.

Specifically, as in FIG. 3b, the first internal electrodes 32 are connected to the first external electrodes 34 through the two first leads 32a and 32b, while the second internal electrodes 33 are connected to the second external electrodes 35 through the two second leads 33a and 33b. Hence, since only the first and second external electrodes 34 and 35 related to one polarity are formed on the top and bottom surfaces of the capacitor body 31, they have sufficient electrode areas on the top and bottom surfaces of the body 31. In the present embodiment, the first and second external electrodes 34 and 35 may be formed over almost the entire area of the top and bottom surfaces of the capacitor body 31. The pluralities of leads 32a and 32b, and 33a and 33b (two each in the present embodiment), functioning to connect the internal electrodes 32 and 33 to the external electrodes 34 and 35 having the same polarity, are provided to increase the contact paths between the internal electrodes and the external electrodes. Thereby, the ESR and ESL are further reduced.

In particular, when the MLCC shown in FIG. 3a is embedded in the PCB, the first and second external electrodes 34 and 35 are provided over almost the entire area of the top and bottom surfaces of the capacitor body 31, thus ensuring larger connection areas.

Figure 4A:
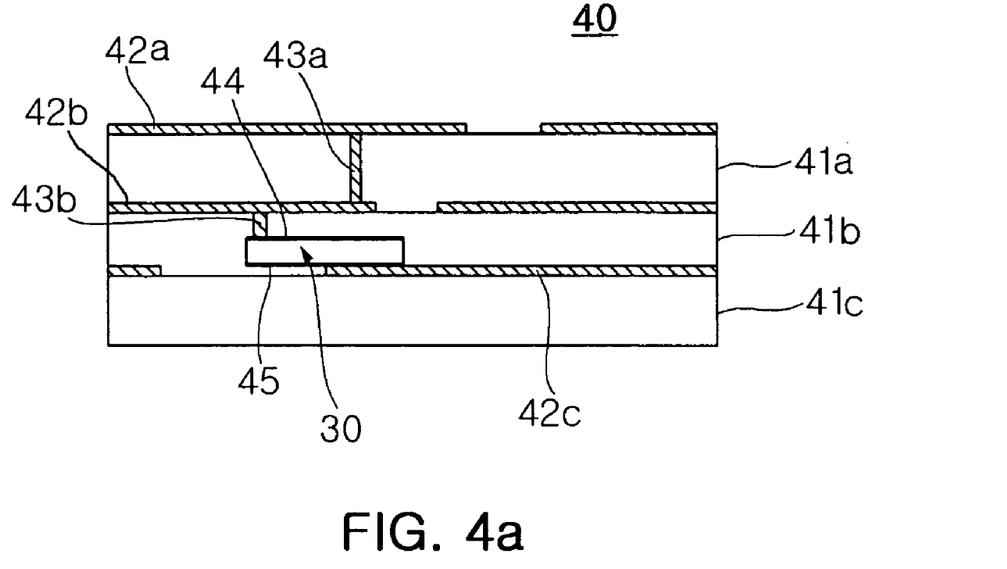
FIGS. 4a and 4b are a side sectional view and a top plan view, respectively, showing a PCB in which the MLCC of FIG. 3a has been embedded.
Figure 4B:
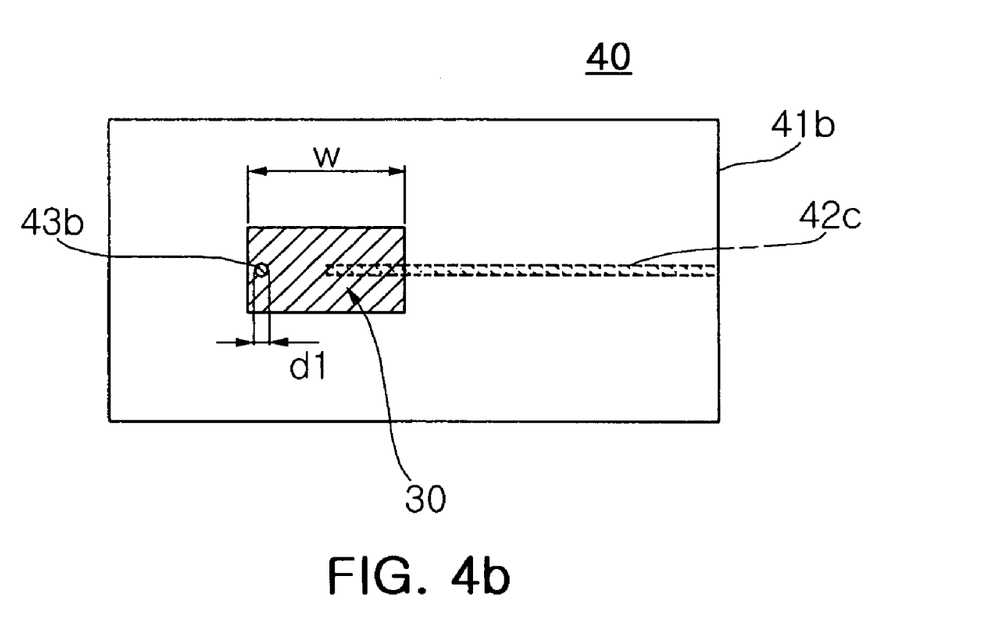

FIGS. 4a and 4b are a side sectional view and a top plan view, respectively, showing a PCB 40 including the MLCC of FIG. 3a.

In FIG. 4a, the PCB 40, in which the MLCC 30 of FIG. 3a has been embedded, is depicted. The PCB 40 is composed of three layers 41a, 41b and 41c, on which predetermined conductive lines 42a, 42b and 42c are formed.

A cavity is formed in the middle layer 41b of the PCB 40, and the MLCC 30 is mounted in the cavity. As such, the conductive line 42a, along with the conductive line 42b of the other layer 41b, is connected to the first external electrode 34 through the conductive via holes 43a and 43b, and the ground conductive line 42c is connected to the second external electrode 35 by soldering.

In such a connection structure, as in FIG. 4b, since the external electrodes 34 of the MLCC 30 are formed over almost the entire surface of the top surface of the capacitor body thereof to have a large area, they are easily connected to the PCB by the via hole 43b or by soldering. That is, when the external electrodes 34 of the MLCC 30 and the conductive line 42a or 42b of the PCB 40 are connected using the via holes having the same diameter ($d_1$), the external electrodes 34 of the present invention have a larger width (W) than a conventional thin capacitor shown in FIG. 2b, and therefore, a remarkably large allowable dimensional range is assured. Further, since the first external electrodes 34 having one polarity are formed on the top surface of the capacitor body 31 and the second external electrodes 35 having the other polarity are formed on the bottom surface thereof, short circuits therebetween are prevented.

In the present embodiment, the first external electrodes are connected to the conductive lines using the via holes and the second external electrodes are connected to the other conductive line by soldering, however the present invention is not limited thereto. The conductive lines and via holes of the PCB may be variously changed depending on circuit structures required for actual products.

Figure 5:
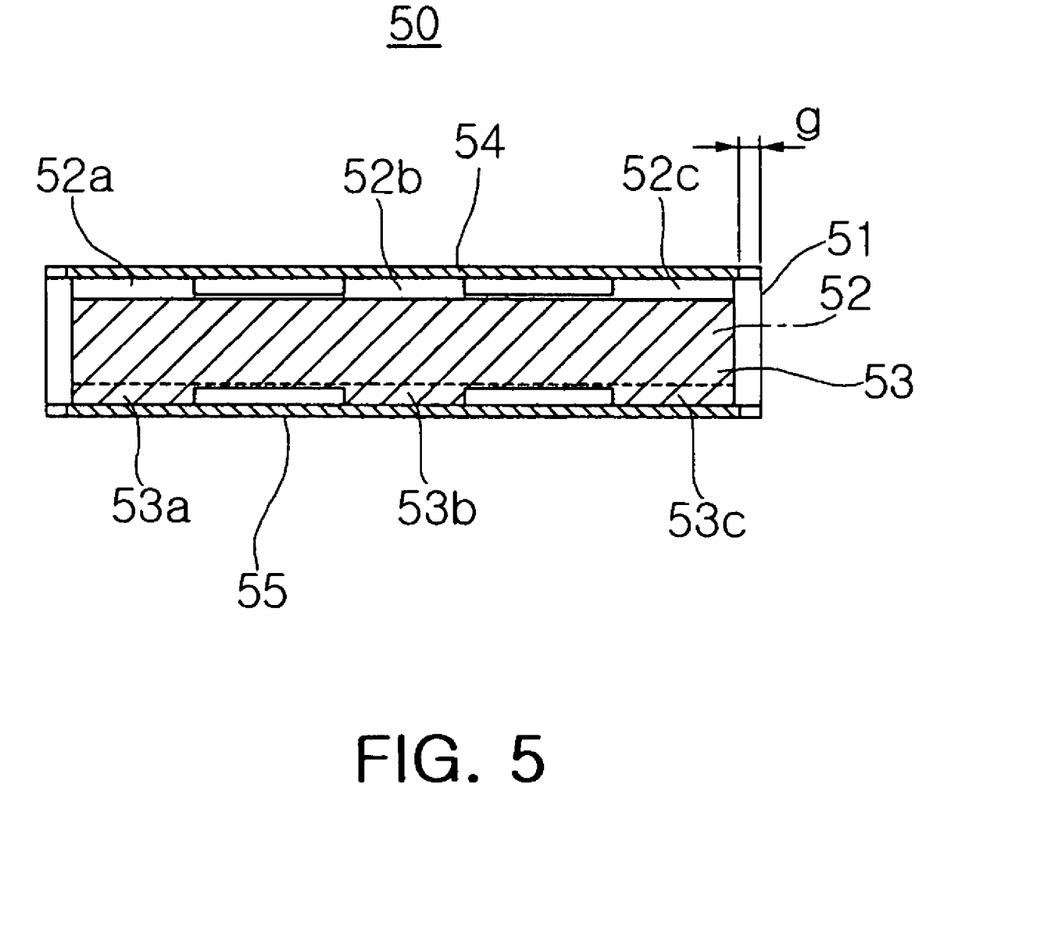
FIG. 5 is a side sectional view showing an MLCC according to a second embodiment of the present invention.

FIG. 5 is a side sectional view showing an MLCC 50 according to a second embodiment of the present invention. Since the present drawing is a side sectional view, one first internal electrode 52 and one second internal electrode 53 are illustrated. However, it is understood that a plurality of pairs of first and second internal electrodes 52 and 53 are alternately arranged on the dielectric layers constituting a capacitor body 51, as in FIG. 3a.

As shown in FIG. 5, the MLCC 50 includes the capacitor body 51 formed by stacking the plurality of dielectric layers, in which first and second external electrodes 54 and 55 are formed on the top and bottom surfaces formed in a stacking direction of the dielectric layers in the capacitor body 51.

First and second internal electrodes 52 and 53, which are formed on the dielectric layers, have three first and second leads 52a, 52b and 52c, and 53a, 53b and 53c, respectively. The first internal electrodes 52 are connected to the first external electrodes 54 through the three first leads 52a, 52b and 52c, while the second internal electrodes 53 are connected to the second external electrodes 55 through the three second leads 53a, 53b and 53c. Therefore, the number of connection paths between the internal electrodes 52 and 53 and the external electrodes 54 and 55 is additionally increased, thus further reducing the ESR and ESL, compared to the structure seen in FIG. 3a.

In the present embodiment, the first and second external electrodes 54 and 55 are formed over almost the entire area of the top and bottom surfaces of the capacitor body 51. As such, these electrodes are spaced at predetermined intervals g apart from all edges of the top and bottom surfaces of the capacitor body 51, to prevent undesired connection of the side surfaces of the capacitor 50 to other conductive lines or via holes of the PCB (not shown).

A better understanding of the present invention may be obtained in light of the following examples which are set forth to illustrate, but are not to be construed to limit the present invention.

EXAMPLE

The present example was performed to confirm reduction of ESR and ESL and improvement of parallel resonance frequencies of the MLCCs according to the present invention.

As the Comparative Example, a conventional MLCC having the structure shown in FIG. 1a was manufactured. Specifically, four pairs of the first and second internal electrodes were used to manifest capacitance of 3.32 nF, thus manufacturing a 1.6×0.8×0.2 mm sized MLCC. In addition, first and second external electrodes, which had been formed on the opposite side surfaces of the capacitor using a dipping process, extended about 0.3 mm toward other surfaces neighboring the above side surfaces.

As Inventive Examples, an MLCC having the structure shown in FIG. 3a (Inventive Example 1) and an MLCC having the structure shown in FIG. 5 (Inventive Example 2) were manufactured the size same as the MLCC of the Comparative Example. Nevertheless, the MLCCs of Inventive Examples 1 and 2 were structurally different from the MLCC of the Comparative Example. That is, the MLCCs of Inventive Examples 1 and 2 were manufactured using eight pairs of first and second internal electrodes having smaller areas to manifest capacitances of 3.34 nF and 3.37 nF.

In this way, the MLCCs of the Comparative Example and Inventive Examples 1 and 2 were manufactured to have the same size and similar capacitance values (although these values are slightly different, they hardly affect the measured results), after which the ESR and ESL values were measured. The results are given in Table 1, below.

TABLE 1

| Example | ESR (Ω) | ESL (pH) |
|---|---|---|
| Comparative | 0.0172 | 47.8 |
| Inventive 1 (two leads each) | 0.0067 | 23.1 |
| Inventive 2 (three leads each) | 0.0046 | 19.4 |

As is apparent from Table 1, the MLCCs manufactured in Inventive Examples 1 and 2 have ESR reduced to 38% and 26%, respectively, and have ESL reduced to 48% and 40%, respectively, compared to the MLCC of the Comparative Example. Therefore, the MLCCs according to the present invention are confirmed to have superior high frequency properties. In the thin structures of the MLCCs having the same size of Inventive Examples 1 and 2, the number of internal electrode layers is sufficiently increased to reduce the high resistance and inductance of one internal electrode, thereby realizing the low ESR and ESL. Further, such results are significantly represented in the MLCC of Inventive Example 2. This is because the connection paths are enlarged by increasing the number of leads in the MLCC of Inventive Example 2.

To observe the improvement of parallel resonance frequency properties due to the reduction of parasitic capacitance, the MLCCs of the Comparative Example and Inventive Example 1 were measured for attenuation varying with frequency. The results are depicted in FIG. 6a (Comparative Example) and FIG. 6b (Inventive Example 1).

Figure 6A:
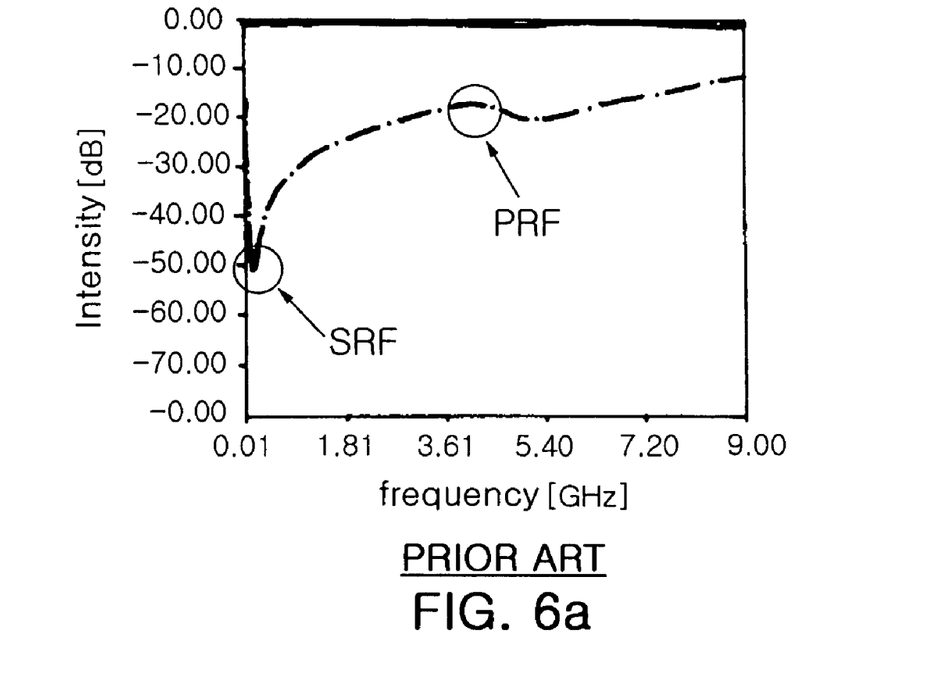
FIGS. 6a and 6b are graphs showing parallel resonance frequencies of the conventional MLCC and the MLCC of the present invention.
Figure 6B:
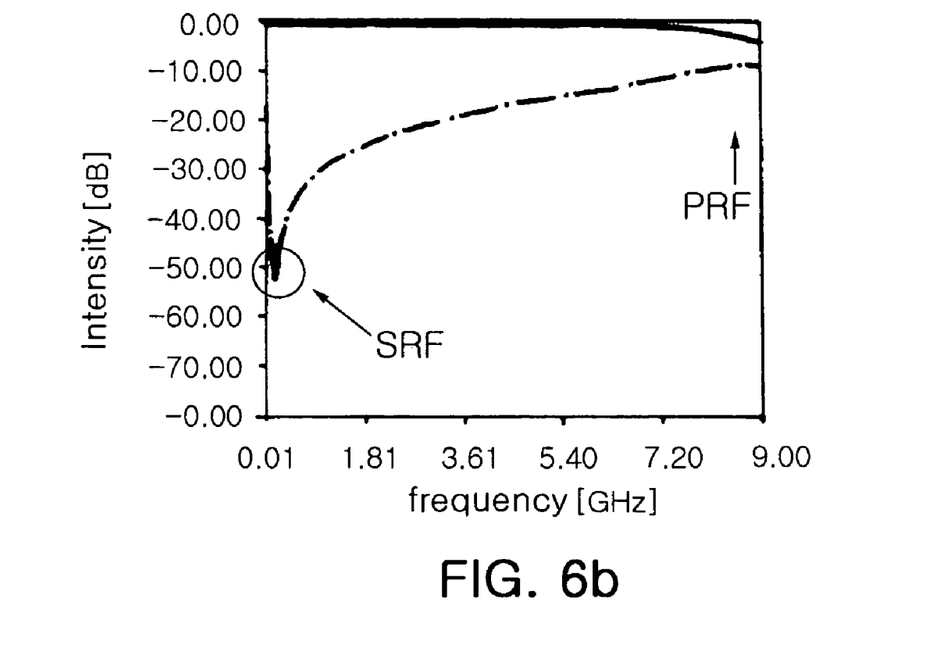

As shown in FIGS. 6a and 6b, although series resonance frequencies (SRF) have almost no changes, parallel resonance frequencies (PRF) are generated at 3.5 GHz (FIG. 6a) and 9 GHz or more (FIG. 6b). As such, it appears that the PRF of the inventive MLCC exceeds the normal available frequency range, thus preventing negative effects due to the PRF at high frequencies.

As described hereinbefore, the present invention provides an MLCC and a PCB having an embedded MLCC. In the MLCC of the present invention, the external electrodes are formed to be perpendicular to the internal electrodes, whereby parasitic capacitance is reduced, resulting in no parallel resonance frequency effects. In addition, the MLCC has a capacitor structure, which provides a first surface and a second surface formed in a stacking direction of the dielectric layers in the capacitor body as a top surface and a bottom surface. Hence, in the thin capacitors having the same size, the number of internal electrode layers is increased, thereby reducing the ESR and ESL. Further, the PCB having an embedded MLCC is easily manufactured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multilayered chip capacitor, comprising:
    a capacitor body, which is formed by stacking a plurality of dielectric layers and provides opposite first and second surfaces formed in a stacking direction of the plurality of dielectric layers as top and bottom surfaces;
    at least one pair of first and second internal electrodes which is formed on the plurality of dielectric layers to be spaced apart from the top and bottom surfaces of the capacitor body, and is alternately arranged on the plurality of dielectric layers so that one electrode of one pair of internal electrodes faces the other electrode of the one pair of internal electrodes with one of the plurality of dielectric layers interposed therebetween;
    a first external electrode and a second external electrode formed on the top and bottom surfaces, respectively, of the capacitor body;
    at least one of the first and second external electrodes formed over almost the entire area of the respective surface of the capacitor body such that a set back from an edge around the capacitor body is formed;
    a plurality of first leads protruding from the first internal electrodes so that the first internal electrodes are connected to the first external electrode;
    a plurality of second leads protruding from the second internal electrodes so that the second internal electrodes are connected to the second external electrode;
    the first and second leads formed in identical numbers;
    one first lead formed at each end of each first internal electrode;
    at least one first lead formed on each first internal electrode between the first leads formed at each end of each first internal electrode;
    one second lead formed at each end of each second internal electrode; and
    at least one second lead formed on each second internal electrode between the second leads formed at each end of each second internal electrode.

2. The multilayered chip capacitor as set forth in claim 1, wherein the capacitor body has a thickness smaller than lengths and widths of top and bottom surfaces thereof.

3. The multilayered chip capacitor as set forth in claim 1, wherein at least one of the first and second external electrodes is spaced apart from at least one edge of the top and bottom surfaces on which the at least one external electrode has been formed.

4. A printed circuit board having an embedded multilayered chip capacitor, comprising:
    a multilayered printed circuit board, which includes a plurality of layers and a plurality of conductive lines thereon; and
    a multilayered chip capacitor, which includes a capacitor body formed by stacking a plurality of dielectric layers and provides opposite first and second surfaces formed in a stacking direction of the plurality of dielectric layers as top and bottom surfaces, and a first external electrode and a second external electrode formed on the top and bottom surfaces, respectively, of the capacitor body, and which is embedded in the multilayered printed circuit board to electrically connect the first external electrode and the second external electrode of the multilayered chip capacitor to predetermined conductive lines of the printed circuit board,
    wherein the multilayered chip capacitor includes at least one pair of first and second internal electrodes which is formed on the plurality of dielectric layers to be spaced apart from the top and bottom surfaces of the capacitor body and is alternately arranged on the plurality of dielectric layers so that one electrode of one pair of internal electrodes faces the other electrode of the one pair of internal electrodes with one of the plurality of dielectric layers interposed therebetween, a plurality of first leads protruding from the first internal electrodes so that the first internal electrodes are connected to the first external electrode, and a plurality of second leads protruding from the second internal electrodes so that the second internal electrodes are connected to the second external electrode
    at least one of the first and second external electrodes formed over almost the entire area of the respective surface of the capacitor body such that a set back from an edge around the capacitor body is formed;
    the first and second leads formed in identical numbers;
    one first lead formed at each end of each first internal electrode;
    at least one first lead formed on each first internal electrode between the first leads formed at each end of each first internal electrode;
    one second lead formed at each end of each second internal electrode; and at least one second lead formed on each second internal electrode between the second leads formed at each end of each second internal electrode.

5. The printed circuit board as set forth in claim 4, wherein the capacitor body has a thickness smaller than lengths and widths of the top and bottom surfaces thereof.

6. The printed circuit board as set forth in claim 4, wherein at least one of the first and second external electrodes and the predetermined conductive line are electrically connected by a conductive via hole formed through the printed circuit board.

7. The printed circuit board as set forth in claim 4, wherein at least one of the first and second external electrodes and the predetermined conductive line are electrically connected by soldering.

8. The printed circuit board as set forth in claim 4, wherein at least one of the first and second external electrodes is spaced apart from at least one edge of the top and bottom surfaces on which the at least one external electrode has been formed.

* * * * *